(12) United States Patent
Lin et al.

(10) Patent No.: US 10,283,605 B2
(45) Date of Patent: May 7, 2019

(54) SELF-ALIGNED METAL GATE ETCH BACK PROCESS AND DEVICE

(71) Applicant: Taiwan Semiconductor Manufacturing Co., Ltd., Hsin-Chu (TW)

(72) Inventors: Chih-Han Lin, Hsinchu (TW); Che-Cheng Chang, New Taipei (TW); Horng-Huei Tseng, HsinChu (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 6 days.

(21) Appl. No.: 15/287,509

(22) Filed: Oct. 6, 2016

(65) Prior Publication Data
US 2017/0222005 A1    Aug. 3, 2017

Related U.S. Application Data

(60) Provisional application No. 62/288,507, filed on Jan. 29, 2016.

(51) Int. Cl.
| | |
|---|---|
| *H01L 21/76* | (2006.01) |
| *H01L 29/423* | (2006.01) |
| *H01L 21/28* | (2006.01) |
| *H01L 29/40* | (2006.01) |
| *H01L 29/51* | (2006.01) |
| *H01L 29/49* | (2006.01) |
| *H01L 29/66* | (2006.01) |

(52) U.S. Cl.
CPC .. *H01L 29/42364* (2013.01); *H01L 21/28008* (2013.01); *H01L 21/28079* (2013.01); *H01L 21/28088* (2013.01); *H01L 21/28114* (2013.01); *H01L 29/401* (2013.01); *H01L 29/4958* (2013.01); *H01L 29/4966* (2013.01); *H01L 29/511* (2013.01); *H01L 29/66545* (2013.01); *H01L 29/513* (2013.01); *H01L 29/517* (2013.01)

(58) Field of Classification Search
None
See application file for complete search history.

(56) References Cited

U.S. PATENT DOCUMENTS

| 7,667,271 B2 | 2/2010 | Yu et al. |
|---|---|---|
| 7,910,453 B2 | 3/2011 | Xu et al. |

(Continued)

FOREIGN PATENT DOCUMENTS

| CN | 104299897 | 1/2015 |
|---|---|---|
| KR | 20110073214 | 6/2011 |

*Primary Examiner* — Calvin Y Choi
(74) *Attorney, Agent, or Firm* — Haynes and Boone, LLP

(57) ABSTRACT

A method of forming a semiconductor device includes receiving a device having a substrate and a first dielectric layer surrounding a gate trench. The method further includes depositing a gate dielectric layer and a gate work function (WF) layer in the gate trench, and forming a hard mask (HM) layer in a space surrounded by the gate WF layer. The method further includes recessing the gate WF layer such that a top surface of the gate WF layer in the gate trench is below a top surface of the first dielectric layer. After the recessing of the gate WF layer, the method further includes removing the HM layer in the gate trench. After the removing of the HM layer, the method further includes depositing a metal layer in the gate trench.

20 Claims, 13 Drawing Sheets

(56) References Cited

U.S. PATENT DOCUMENTS

| | | |
|---|---|---|
| 8,377,779 B1 | 2/2013 | Wang |
| 8,399,931 B2 | 3/2013 | Liaw et al. |
| 8,652,894 B2 | 2/2014 | Lin et al. |
| 8,685,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 2009/0137090 A1* | 5/2009 | Chen ............ H01L 21/28114 438/278 |
| 2011/0147858 A1 | 6/2011 | Lim et al. |
| 2013/0309857 A1* | 11/2013 | Koburger, III ........ H01L 27/088 438/591 |
| 2014/0001574 A1 | 1/2014 | Chen et al. |
| 2014/0110755 A1 | 4/2014 | Colinge |
| 2014/0151812 A1 | 6/2014 | Liaw |
| 2015/0021694 A1* | 1/2015 | Trevino .......... H01L 21/823821 257/368 |
| 2015/0108577 A1* | 4/2015 | Cai ................ H01L 21/28008 257/369 |
| 2015/0118835 A1* | 4/2015 | Lin ................ H01L 29/66477 438/586 |
| 2015/0214314 A1 | 7/2015 | Oh |

* cited by examiner

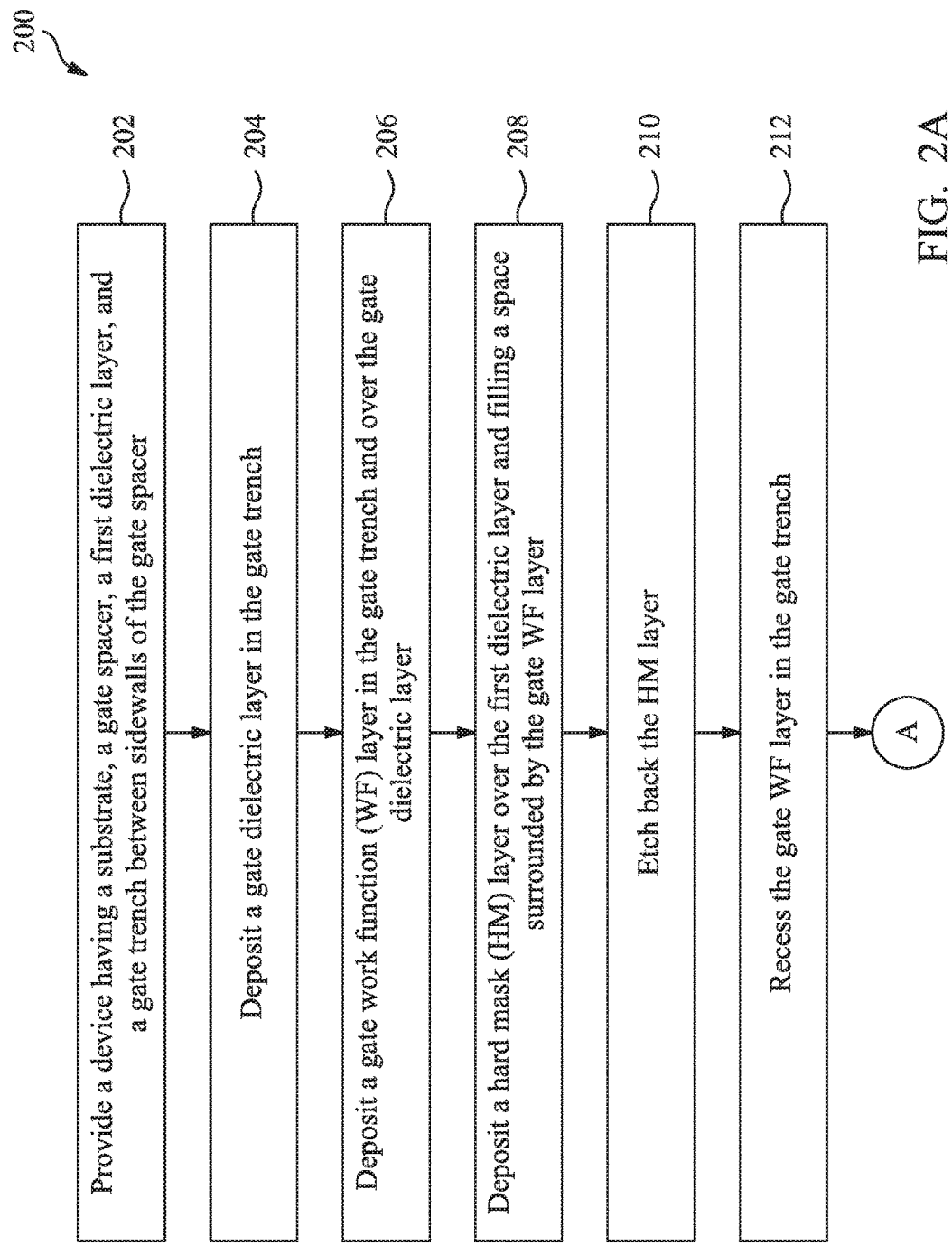

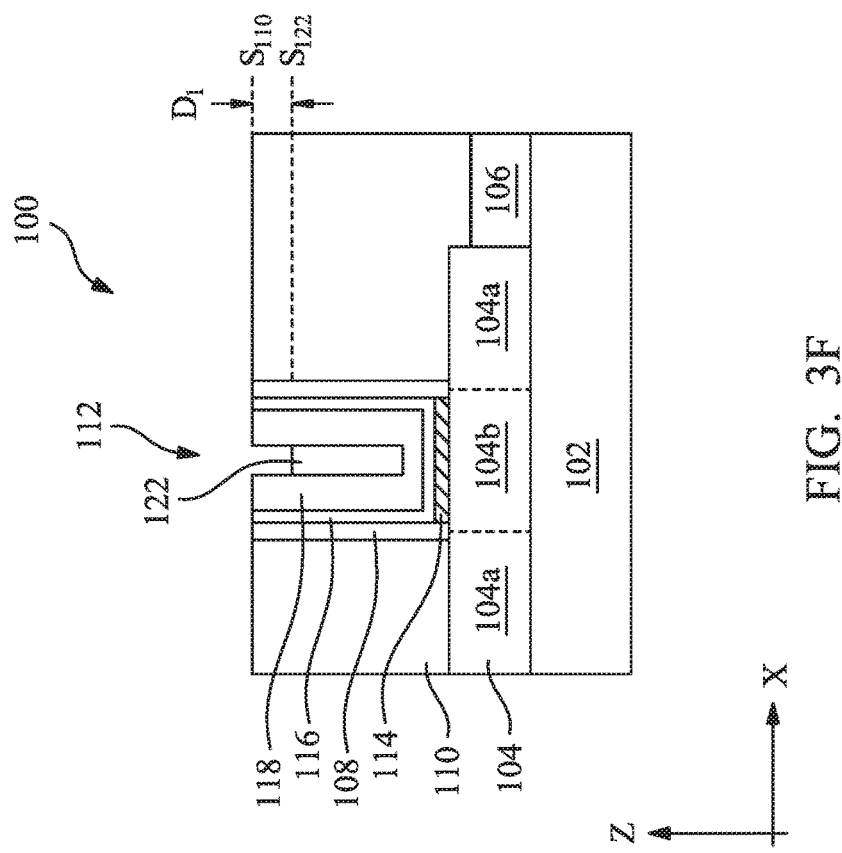
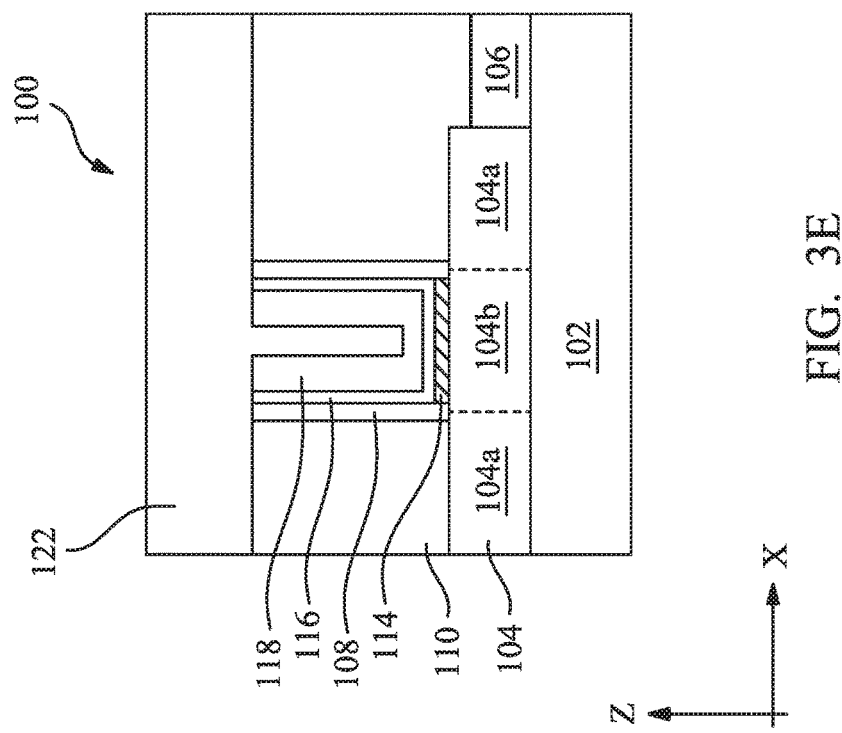
FIG. 3F
FIG. 3E

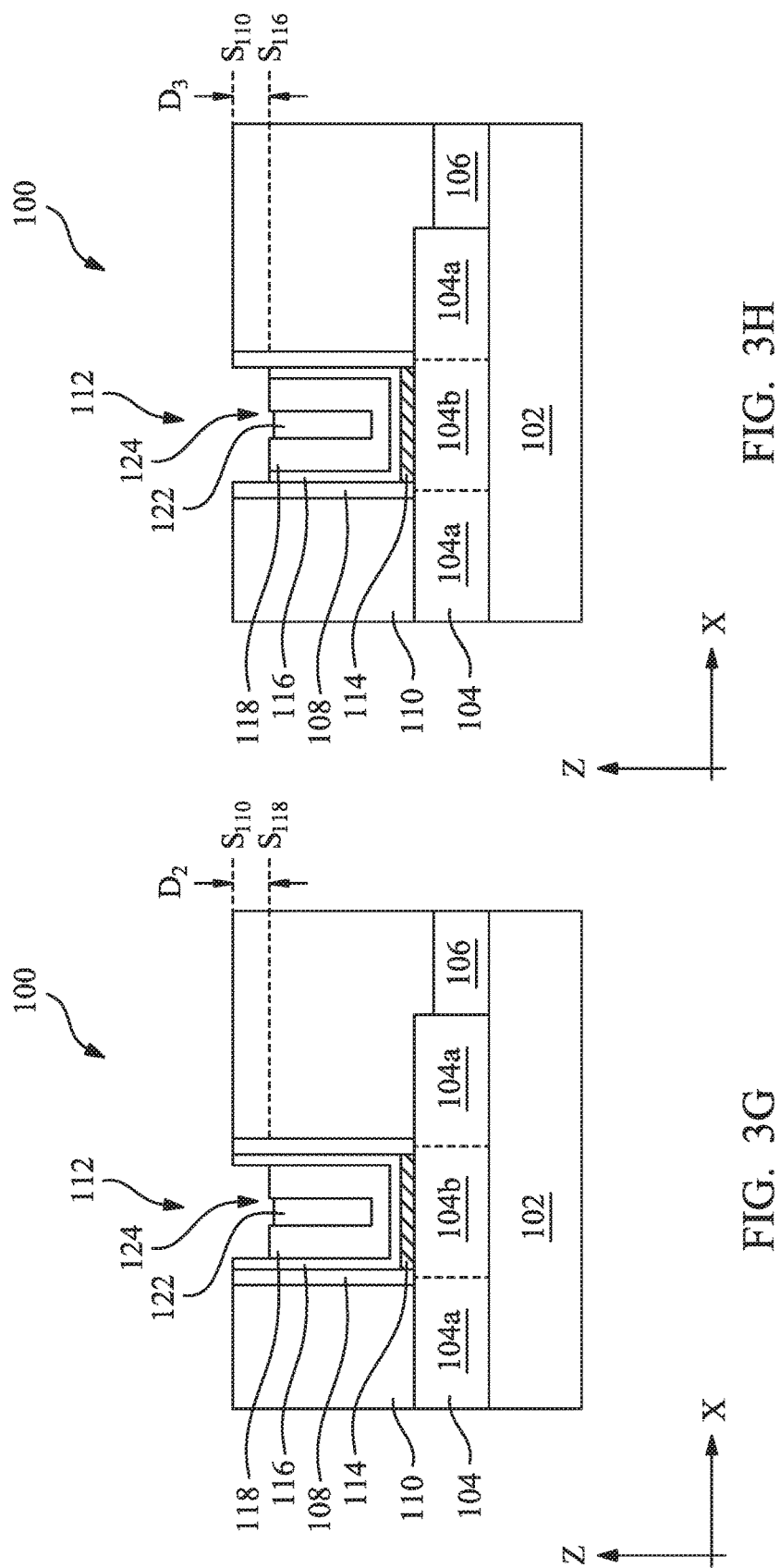

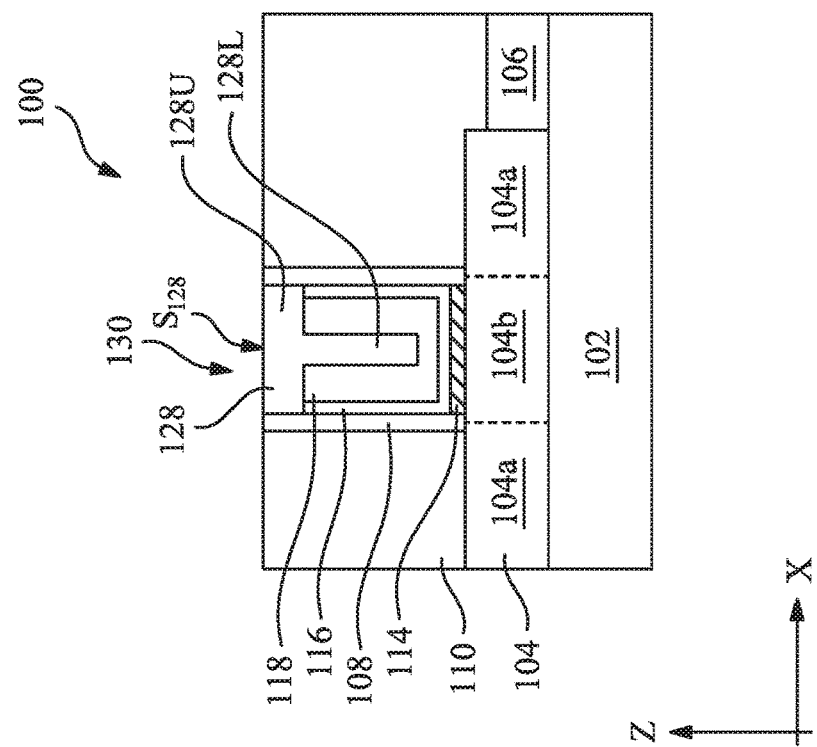
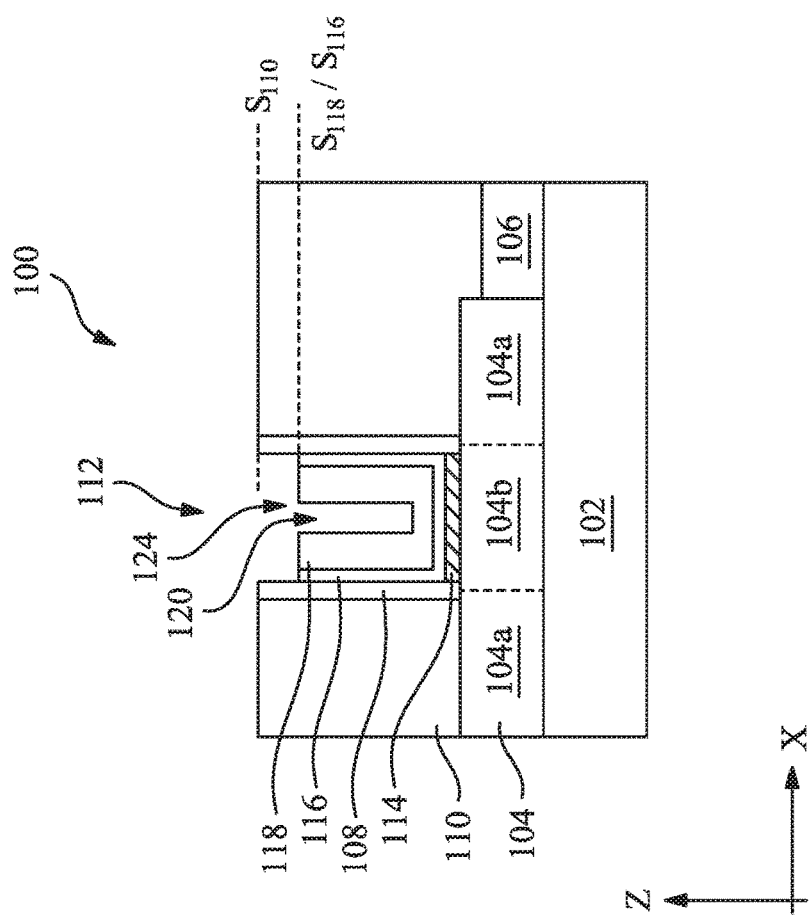
FIG. 3J
FIG. 3I

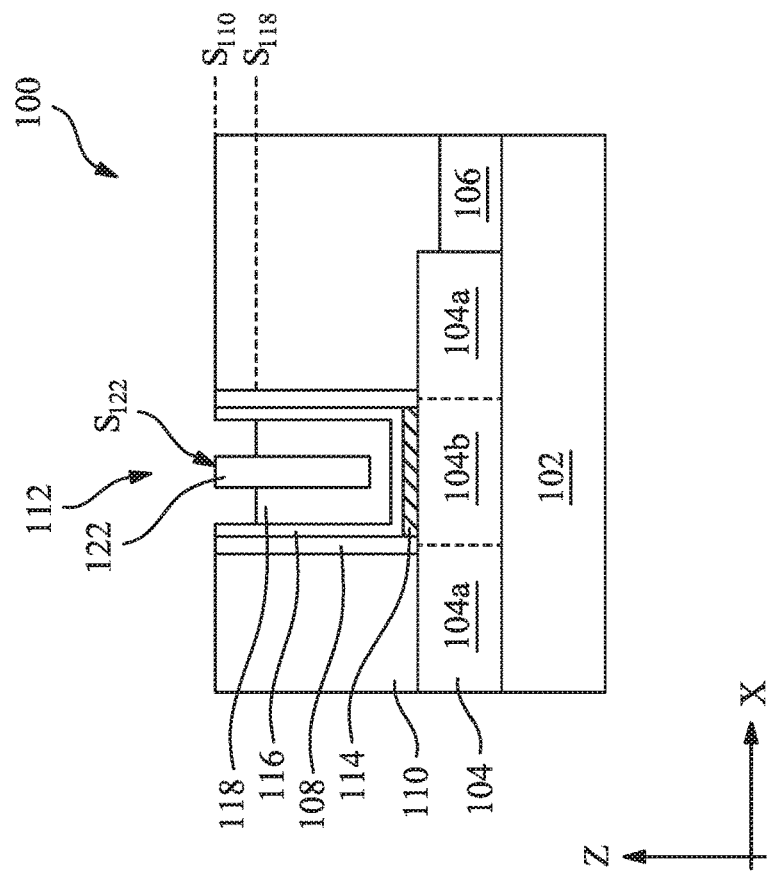
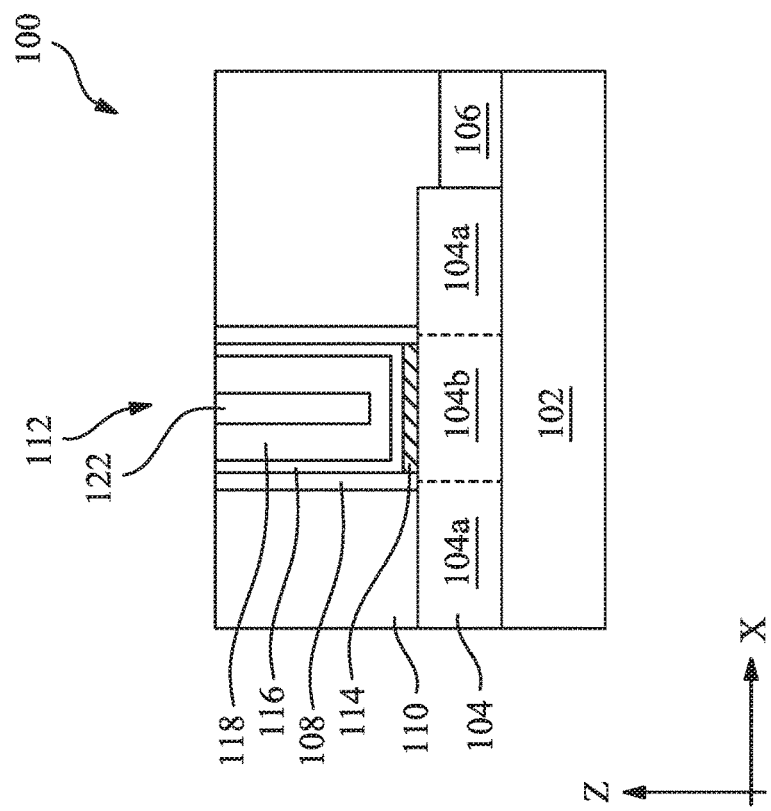
FIG. 5A
FIG. 5B

SELF-ALIGNED METAL GATE ETCH BACK PROCESS AND DEVICE

PRIORITY DATA

This application claims the benefit of U.S. Prov. App. No. 62/288,507 entitled "Self-Aligned Metal Gate Etch Back Process and Device," filed Jan. 29, 2016, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One development in some IC designs has been the replacement of traditional polysilicon gates with high-k/metal gates (HK/MG). A typical HK/MG includes a high-k gate dielectric layer, a work function (WF) metal layer, and a low resistance metal filling layer. Such structure is supposed to improve transistor density and switching speed, while reducing switching power and gate leakage. As technology nodes continue shrinking, some difficulties in the fabrication of HK/MG arise. One of the difficulties is that the metal filling layer may have a small footprint, thus it is difficult for a gate contact to land on the metal filling layer properly.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A and 2B show a block diagram of a method of forming a semiconductor device, according to various aspects of the present disclosure.

FIGS. 3B, 3C, 3D, 3D-1, 3E, 3F, 3G, 3H, 3I, 3J, 3K, and 3L illustrate cross sectional views of forming a target semiconductor device according to the method of FIGS. 2A and 2B, in accordance with some embodiments.

FIGS. 5A, 5B, and 5C illustrate cross sectional views of forming a target semiconductor device according to the method of FIG. 4, in accordance with some embodiments.

DETAILED DESCRIPTION

Figure 1:
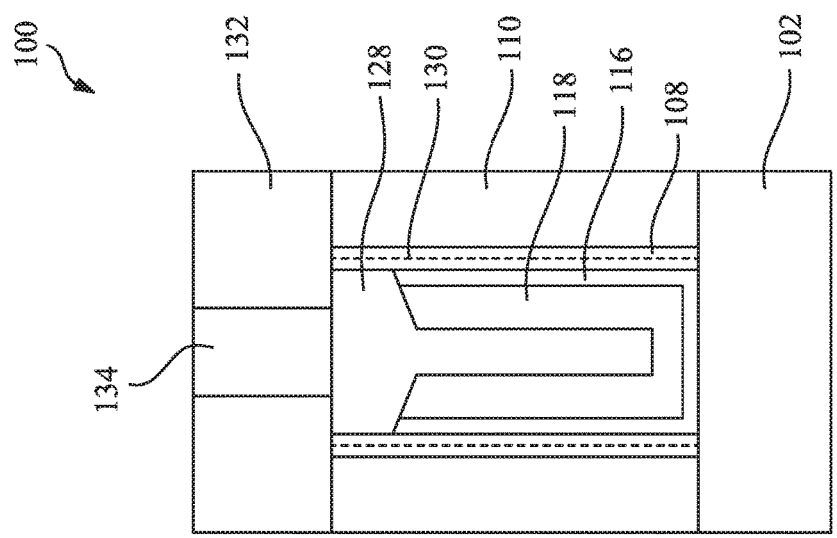
FIG. 1 illustrates a semiconductor device having a metal gate structure constructed according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and fabrication. More particularly, the present disclosure is related to a metal gate, such as high-k metal gate (HK/MG), for field-effect transistors (FETs), and methods of forming the same.

FIG. 1 shows a semiconductor device 100 having a metal gate 130 (enclosed by the dashed line) according to an embodiment of the present disclosure. Referring to FIG. 1, the device 100 includes a substrate 102, a gate spacer 108 disposed over the substrate 102, and a dielectric layer 110 surrounding the gate spacer 108. The device 100 further includes a gate dielectric layer 116, a work function (WF) layer 118, and a metal filling layer 128 deposited in a space defined by the gate spacer 108. A lower portion of the metal filling layer 128 is surrounded by the WF layer 118. The gate dielectric layer 116, the WF layer 118, and the metal filling layer 128 are layers of the metal gate 130. Even though not shown, the device 100 may include other features, such as an interfacial layer under the gate dielectric layer 116, in an embodiment. The gate dielectric layer 116 may comprise a high-k dielectric material, thus making the metal gate 130 a HK/MG. The device 100 further includes another dielectric layer 132 over the various layers 108, 110, and 128. The device 100 further includes a gate contact 134 penetrating the dielectric layer 132 and lands onto the metal gate 130, particularly onto the metal filling layer 128.

Still referring to FIG. 1, a top surface of the metal filling layer 128 is higher than respective top surfaces of the gate dielectric layer 116 and the WF layer 118. The metal filling layer 128 has a relatively larger footprint (from a top view) than the gate dielectric layer 116 and the WF layer 118. As a result, the gate contact 134 directly contacts the metal filling layer 128, but does not directly contact either the gate dielectric layer 116 or the WF layer 118. In embodiments, the metal filling layer 128 comprises a low resistance metal. Due to the large footprint of the metal filling layer 128, the device 100 provides a low gate contact resistance. Particularly, the device 100 provides a lower gate contact resistance than what would be if the metal filling layer 128 had a smaller footprint and the gate contact 134 directly contacted either the WF layer 118 or the gate dielectric layer 116. Furthermore, the large footprint of the metal filling layer 128 advantageously enlarges a process window for fabricating the gate contact 134.

Figure 2B:
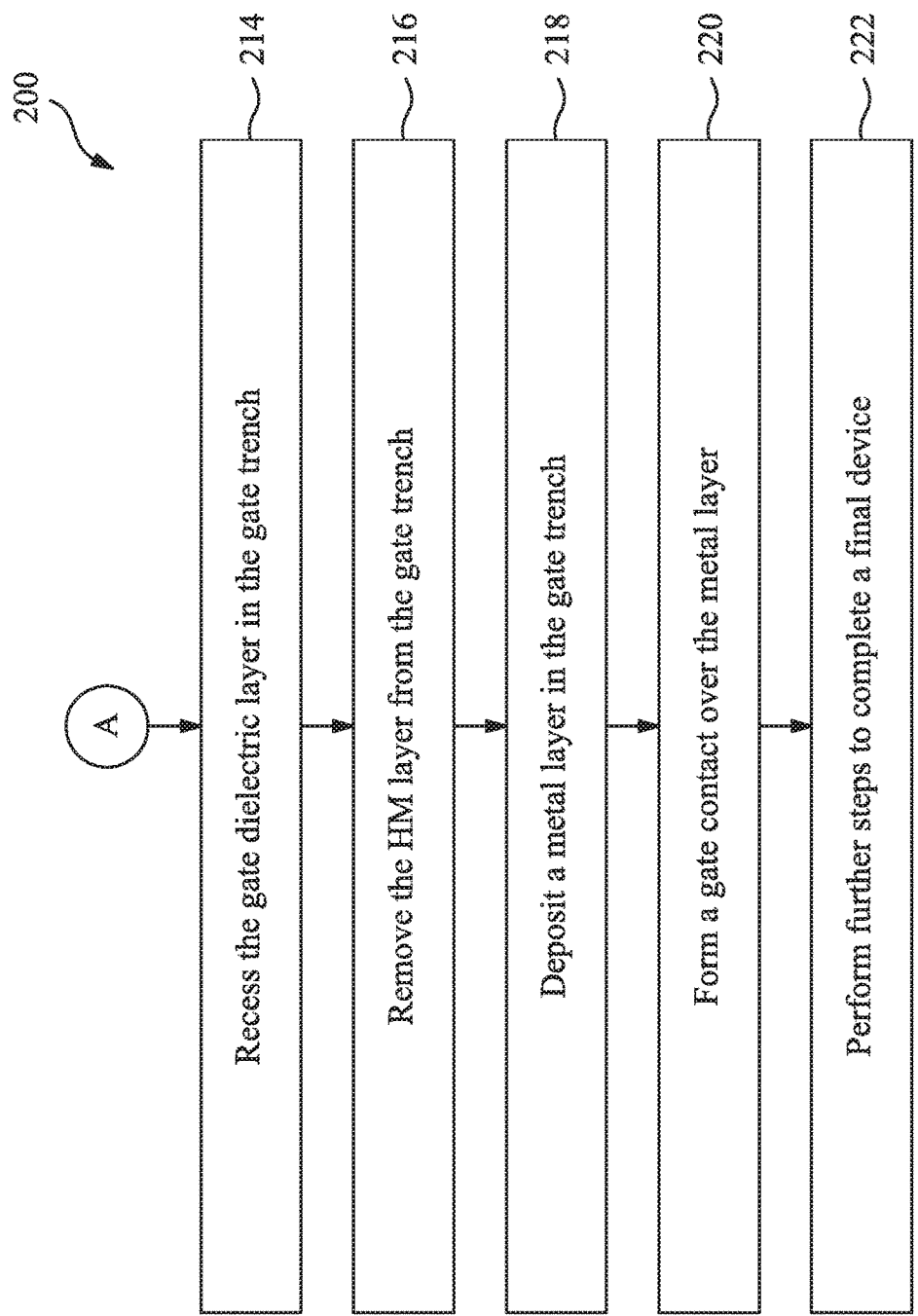
Figure 3B:
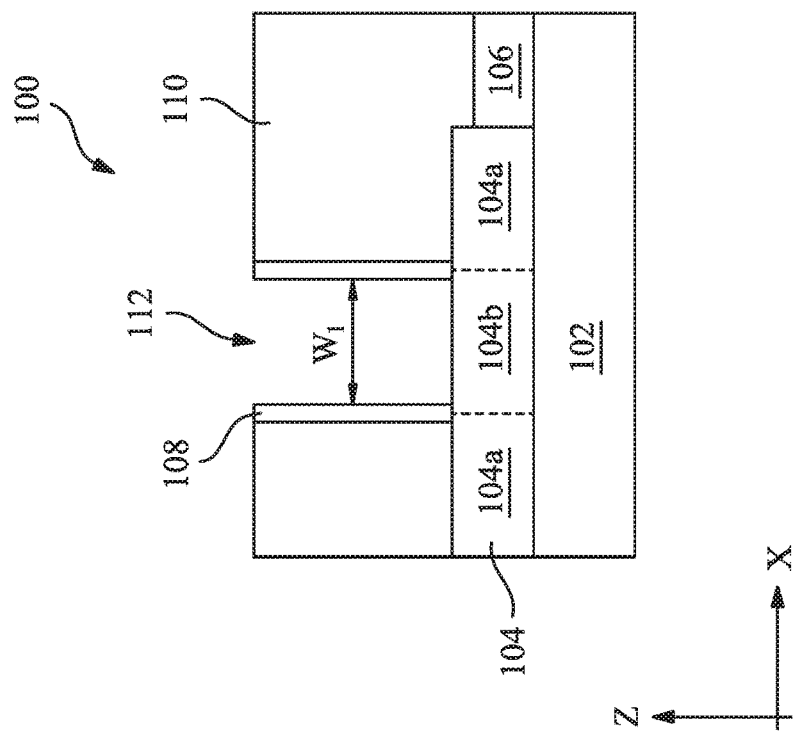
Figure 3A:
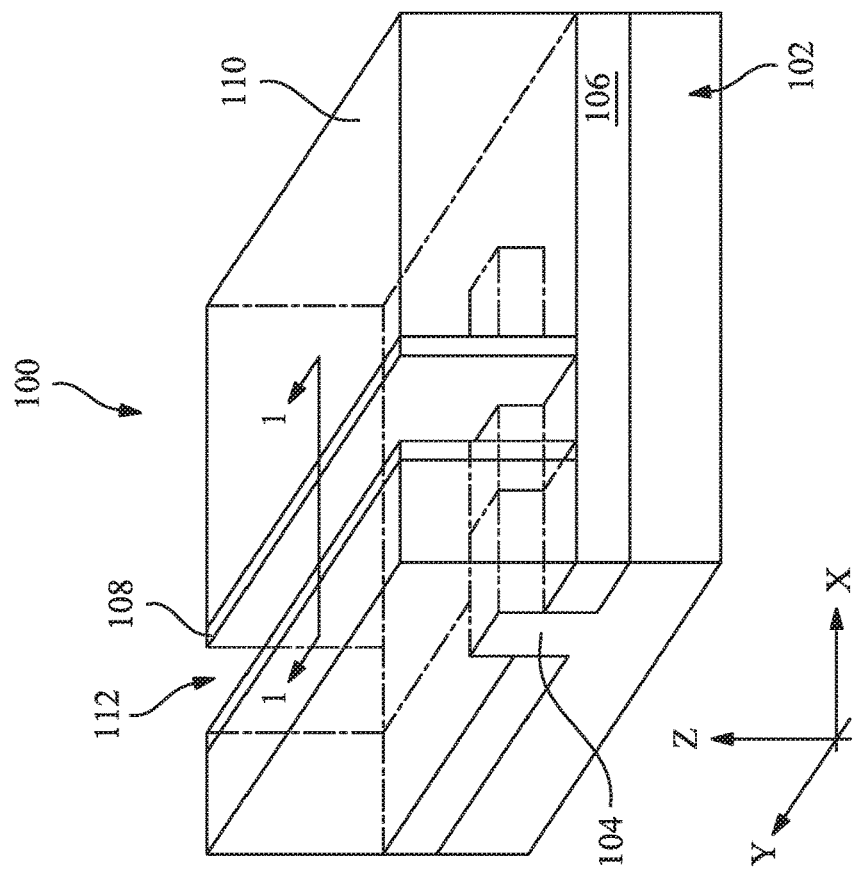
FIG. 3A illustrates a perspective view of a semiconductor device, in portion, during a fabrication stage according to the method of FIGS. 2A and 2B, in accordance with an embodiment.

Referring to FIGS. 2A and 2B, shown therein is a method 200 of forming a semiconductor device, such as the device 100, according to various aspects of the present disclosure. The method 200 is an example, and is not intended to limit the present disclosure beyond what is explicitly recited in the claims. Additional operations can be provided before, during, and after the method 200, and some operations described can be replaced, eliminated, or relocated for additional embodiments of the method. The method 200 is described below in conjunction with FIGS. 3A-3L. FIG. 3A shows a perspective view of a portion of the semiconductor device 100, while FIGS. 3B-3L show cross-sectional views of portions of the semiconductor device 100 along the "1-1" line of FIG. 3A during various stages of fabrication according to aspects of the present disclosure.

As will be shown, the device 100 is a FinFET device. This does not necessarily limit the embodiments to any types of devices, any number of devices, any number of regions, or any configuration of structures or regions. For example, the provided subject matter can be applied in fabricating planar FET devices and other type of multi-gate FET devices for reducing gate contact resistance and for enlarging process windows during gate contact fabrication. Furthermore, the device 100 may be an intermediate device fabricated during the processing of an IC, or a portion thereof, that may comprise static random access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOS-FET), complementary metal-oxide semiconductor (CMOS) transistors, bipolar transistors, high voltage transistors, high frequency transistors, other memory cells, and combinations thereof.

Referring to FIG. 2A, at operation 202, the method 200 provides or is provided with the device 100 at one processing state. Referring to FIGS. 3A and 3B collectively, the device 100 includes a substrate 102, a fin 104 over the substrate 102, and an isolation structure 106 over the substrate 102. The fin 104 protrudes out of the isolation structure 106. The fin 104 includes a channel region 104$b$ and two source/drain regions 104$a$. In the present embodiment, the device 100 further includes a gate spacer 108 disposed over the fin 104 and the isolation structure 106. In an alternative embodiment, the gate spacer 108 may be omitted. Further in the present embodiment, the device 100 includes a dielectric layer 110 surrounding (at least on sidewalls of) the gate spacer 108. The inner sidewalls of the gate spacer 108 define a gate trench 112, which is substantially aligned with the channel region 104$b$ along the "z" direction. The various components of the device 100 are further described below.

The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor-on-insulator (SOI) substrate. The substrate 102 may include epitaxial features, be strained for performance enhancement, and/or have other suitable enhancement features.

The fin 104 includes semiconductor material(s) and is suitable for forming a FinFET device thereon, such as a p-type FinFET or an n-type FinFET. The fin 104 may be fabricated using suitable processes including photolithography and etch processes. The photolithography process may include forming a photoresist (resist) layer overlying the substrate 102, exposing the resist to a pattern, performing post-exposure bake processes, and developing the resist to form a masking element including the resist. The masking element is then used for etching recesses into the substrate 102, leaving the fin 104 on the substrate 102. The etching process can include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. In some embodiments, the fin 104 may be formed by double-patterning lithography (DPL) process. Numerous other embodiments of methods to form the fins 104 on the substrate 102 may be suitable.

The isolation structure 106 may be formed of silicon oxide, silicon nitride, silicon oxynitride, fluoride-doped silicate glass (FSG), a low-k dielectric material, and/or other suitable insulating material. In an embodiment, the isolation structure 106 is formed by etching trenches in the substrate 102, e.g., as part of the fin 104 formation process. The trenches may then be filled with an isolating material, followed by a chemical mechanical planarization (CMP) process. The isolation structure 106 may also comprise field oxide, LOCal Oxidation of Silicon (LOCOS), and/or other suitable structures. The isolation structure 106 may include a multi-layer structure, for example, having one or more thermal oxide liner layers.

The gate spacer 108 may comprise silicon oxide, silicon nitride, silicon carbide nitride (SiCN), silicon oxynitride (SiON), silicon carbide oxynitride (SiCON), or other suitable dielectric material. The gate spacer 108 may be formed by deposition and etching processes. The deposition process may be a chemical vapor deposition (CVD), physical vapor deposition (PVD), atomic layer deposition (ALD), or other suitable deposition techniques. The etching process may be an anisotropic dry etching process in one example. In an embodiment where the method 200 includes a gate-replacement process, the gate spacer 108 is first formed on sidewalls of a dummy gate, and the dummy gate is subsequently removed, thereby providing the gate trench 112 between opposing sidewalls of the gate spacer 108. The gate trench 112 has a dimension $W_1$ along the "x" direction, which is also the channel length direction. The value of the dimension $W_1$ depends on the type of the FinFET device 100 (e.g., a SRAM device or a logic device) as well as the process nodes for forming the FinFET device 100 (e.g., 22 nm, 10 nm, 7 nm, and so on).

The dielectric layer 110 may include one or more dielectric materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric layer 110 may be deposited by a plasma enhanced CVD (PECVD) process, a flowable CVD (FCVD), or other suitable deposition techniques. In an embodiment, the device 100 further includes an etch stop layer (not shown) underneath the dielectric layer 110 and the etch stop layer may comprise silicon nitride, silicon oxide, silicon oxynitride, and/or other materials.

Figure 3D:
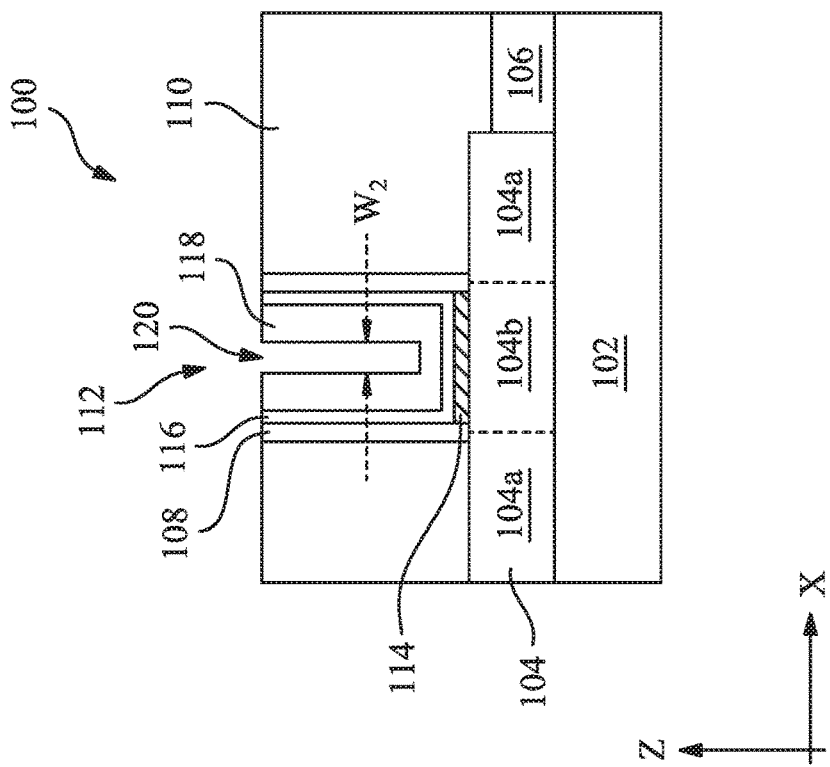
Figure 3C:
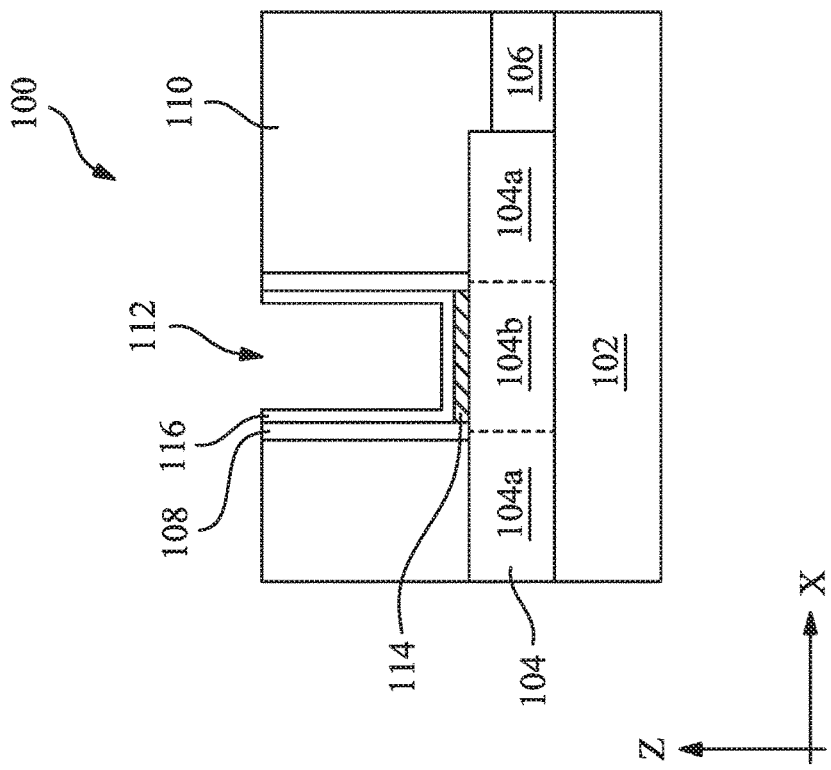
Figures 1, 3D:
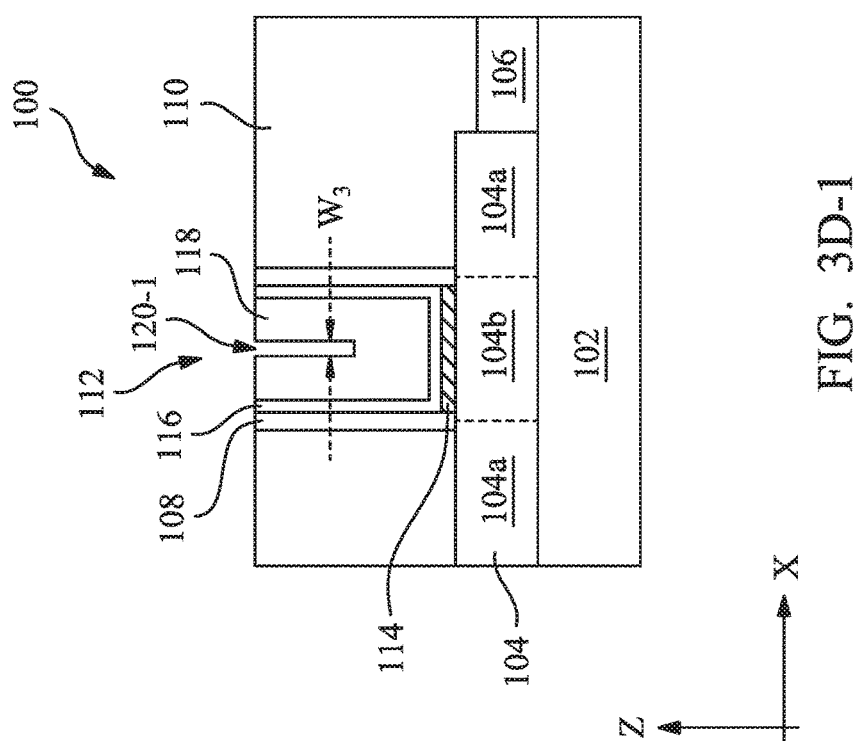

At operation 204, the method 200 (FIG. 2A) deposits a gate dielectric layer 116 in the gate trench 112. Referring to FIG. 3C, the gate dielectric layer 116 is deposited over a bottom surface and sidewall surfaces of the gate trench 112. In the present embodiment, before the depositing of the gate dielectric layer 116, the method 200 deposits an interfacial layer 114 in the gate trench 112 and over the channel region 104b. The interfacial layer 114 may include a dielectric material such as silicon oxide layer ($SiO_2$) or silicon oxynitride (SiON), and may be formed by chemical oxidation, thermal oxidation, ALD, CVD, and/or other suitable techniques. In an alternative embodiment, the interfacial layer 114 is omitted.

Continuing with the present embodiment as shown in FIG. 3C, the gate dielectric layer 116 is deposited over the interfacial layer 114. The gate dielectric layer 116 may include a high-k dielectric material such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. The gate dielectric layer 116 may be formed by ALD and/or other suitable methods.

At operation 206, the method 200 (FIG. 2A) deposits a gate WF layer 118 over the bottom and sidewalls of the gate trench 112. Referring to FIG. 3D, the gate WF layer 118 is deposited over the gate dielectric layer 116 and partially fills the gate trench 112. The gate WF layer 118 may be a p-type or an n-type work function layer depending on the type of the FinFET 100. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal with a sufficiently low effective work function, selected from but not restricted to the group of titanium (Ti), aluminum (Al), tantalum carbide (TaC), tantalum carbide nitride (TaCN), tantalum silicon nitride (TaSiN), or combinations thereof. The gate WF layer 118 may include a plurality of layers and may be deposited by CVD, PVD, and/or other suitable process. In an embodiment, the method 200 performs a CMP process to remove excessive material(s) of the gate dielectric layer 116 and the gate WF layer 118 outside of the gate trench 112, thereby planarizing a top surface of the device 100.

Still referring to FIG. 3D, the gate WF layer 118 provides a space 120 that has a dimension $W_2$ along the "x" direction. As will be shown later, a metal filling layer (such as the metal filling layer 128 of FIG. 1) will be deposited into the space 120. In the present embodiment, the width $W_2$ is equal to or greater than a critical dimension for depositing the metal filling layer 128. As the process nodes become smaller, the space 120 may also become smaller. As shown in FIG. 3D-1, in an example, after the gate WF layer 118 is deposited, a space 120-1 as surrounded by the gate WF layer 118 has a dimension $W_3$ that is smaller than the critical dimension. Consequently, the metal filling layer 128 might not be properly filled into the space 120-1 due to its narrow profile. To further this example, the method 200 expands the space 120-1 through patterning and etching processes such that the space 120-1 is enlarged, as shown in FIG. 3D. The patterning process may include photolithography and the etching process may be selectively tuned to etch the gate WF layer 118.

At operation 208, the method 200 (FIG. 2A) deposits a hard mask (HM) layer 122 over the layers 108, 110, 116, and 118 and filling the space 120. Referring to FIG. 3E, the HM layer 122 may include a dielectric material such as silicon oxide ($SiO_2$), silicon nitride (SiN), silicon carbide nitride (SiCN), silicon carbide oxynitride (SiCON), silicon oxynitride (SiON), other suitable dielectric material, or a combination thereof. The HM layer 122 may be formed by ALD, thermal oxidation, chemical oxidation, CVD, PVD, or other deposition techniques. In an embodiment, the HM layer 122 is a resist and is formed by a process that includes spin-coating. In various embodiments, the HM layer 122 has an etching selectivity with respect to the layers 108, 110, 116, and 118. In an embodiment, the HM layer 122 is deposited over an entire surface of the device 100 that includes both PFETs and NFETs.

At operation 210, the method 200 (FIG. 2A) etches back the HM layer 122. Referring to FIG. 3F, the portion of the HM layer 122 that overlays the layers 108, 110, 116, and 118 is removed. Further, the portion of the HM layer 122 in the space 120 (FIG. 3D) is recessed such that a top surface $S_{122}$ of the HM layer 122 is below a top surface $S_{110}$ of the dielectric layer 110 by a dimension $D_1$ along the "z" direction. In an embodiment where the device 100 includes both PFETs and NFETs, the HM layer 122 may be etched back in PFETs (or NFETs) areas, while it is protected by a masking element in NFETs (or PFETs) areas. This enables separate tuning of the performance for PFETs and NFETs. Such separate PFETs and NFETs tuning may be similarly applied in subsequent operations including operations 212, 214, 216, and 218 to be discussed later. In embodiments, the operation 210 may use a wet etching, a dry etching, an atomic layer etching (ALE), a reactive ion etching, or other etching back techniques. Further, in an embodiment, the operation 210 uses a selective etching that is tuned to etch the HM layer 122 while the layers 108, 110, 116, and 118 remain substantially unchanged. Still further, the etching of the HM layer 122 is self-aligned, i.e., the HM layer 122 is etched without a photolithography patterning process except the separate tuning of the PFETs and NFETs as aforementioned. The operation 210 may control the depth $D_1$ using a timer mode in one example.

At operation 212, the method 200 (FIG. 2A) recesses the gate WF layer 118 in the gate trench 112. Referring to FIG. 3G, the gate WF layer 118 is recessed such that a top surface $S_{118}$ of the gate WF layer 118 is below the top surface $S_{110}$ by a dimension $D_2$ along the "z" direction. A space 124 between the respective top surfaces of the layers 118/122 and the top surface $S_{110}$ has a larger footprint than the space 120 (FIG. 3D) from a top view. In embodiments, the surface $S_{118}$ may be higher or lower than the surface $S_{122}$ along the "z" direction. Alternatively, the surface $S_{118}$ may be at a substantially same level as the surface $S_{122}$. The operation 212 may include a dry etching, a wet etching, ALE, or other etching techniques. Further, the operation 212 includes an etching process that is selectively tuned to etch the gate WF layer 118 while the layers 108, 110, 116, and 122 remain substantially unchanged. The HM layer 122 protects a bottom surface and portions of sidewalls of the gate WF layer from the etching process. The operation 212 may control the dimension $D_2$ using a timer mode in one example. As will be shown, the dimension $D_2$ is related to a thickness of the metal filling layer 128 (FIG. 1). Further, the etching of the gate WF layer 118 is self-aligned, i.e., the gate WF layer 118 is recessed within the gate trench 112 without a photolithography patterning process.

At operation 214, the method 200 (FIG. 2B) recesses the gate dielectric layer 116 in the gate trench 112. Referring to FIG. 3H, the gate dielectric layer 116 is recessed such that a top surface $S_{116}$ of the gate dielectric layer 116 is below the top surface $S_{110}$ by a dimension $D_3$ along the "z" direction. The operation 214 further expands the space 124 along the "x" direction. In embodiments, the surface $S_{116}$ may be higher or lower than the surface $S_{118}$ along the "z" direction. Alternatively, the surface $S_{116}$ may be at a substantially same level as the surface $S_{118}$. The operation 214 may include a dry etching, a wet etching, ALE, or other etching techniques. Further, the operation 214 includes an etching process that is selectively tuned to etch the gate dielectric layer 116 while the layers 108, 110, 118, and 122 remain substantially unchanged. The operation 214 may control the dimension $D_3$ using a timer mode in one example. As will be shown, the dimension $D_3$ is also related to the thickness of the metal filling layer 128 (FIG. 1) in some embodiments. Further, the etching of the gate dielectric layer 116 is self-aligned, i.e., the gate dielectric layer 116 is recessed within the gate trench 112 without a photolithography patterning process.

In an embodiment of the method 200, the operation 214 is not performed, and the method 200 proceeds from the operation 212 to operation 216 without recessing the gate dielectric layer 116. In another embodiment of the method 200, the operations 212 and 214 are performed in one fabrication step, i.e., the gate WF layer 118 and the gate dielectric layer 116 are etched at the same time. To further this embodiment, the layers 116 and 118 are etched using the same recipe which includes etchants for both layers. For example, the recipe may use a fluorine-containing gas (e.g., $CF_4$, $SF_6$, $CH_2F_2$, $CHF_3$, and/or $C_2F_6$) to etch the gate WF layer 118 and use a chlorine-containing gas (e.g., $Cl_2$, $CHCl_3$, $CCl_4$, and/or $BCl_3$) to etch the gate dielectric layer 116 at the same time.

At operation 216, the method 200 (FIG. 2B) removes the HM layer 122 from the gate trench 112. Referring to FIG. 3I, shown therein is the device 100 after the HM layer 122 is removed. Within the gate trench 112, the device 100 includes a recessed gate HM layer 118 and a recessed gate dielectric layer 116. A space is provided in the gate trench 112 and includes the spaces 120 and 124. Many respects of the operation 216 are similar to those of the operation 210 in various embodiments. Particularly, the operation 216 uses a selective etching that is tuned to etch the HM layer 122 while the layers 108, 110, 116, and 118 remain substantially unchanged. The operation 216 may perform a cleaning process that cleans the various surfaces surrounding the spaces 120 and 124.

At operation 218, the method 200 (FIG. 2B) deposits a metal filling layer 128 (or a metal layer 128) in the gate trench 112. Referring to FIG. 3J, the metal filling layer 128 fills the spaces 120 and 124. The metal filling layer 128 may include aluminum (Al), tungsten (W), cobalt (Co), copper (Cu), and/or other suitable materials. The metal filling layer 128 may be deposited by CVD, PVD, plating, and/or other suitable processes. In an embodiment, the operation 218 further includes a CMP process that removes excessive metal material outside of the gate trench 112 and planarizes a top surface of the device 100. As a result, a top surface $S_{128}$ of the metal filling layer 128 is substantially coplanar with the surface $S_{110}$. Still referring to FIG. 3J, the metal filling layer 128 has two portions: a lower portion 128L surrounded by the gate WF layer 118, and an upper portion 128U over the lower portion 128L and above the respective top surfaces $S_{118}$ and $S_{116}$. The upper portion 128U has a larger footprint (or area) than the lower portion 128L from a top view.

Figure 3K:
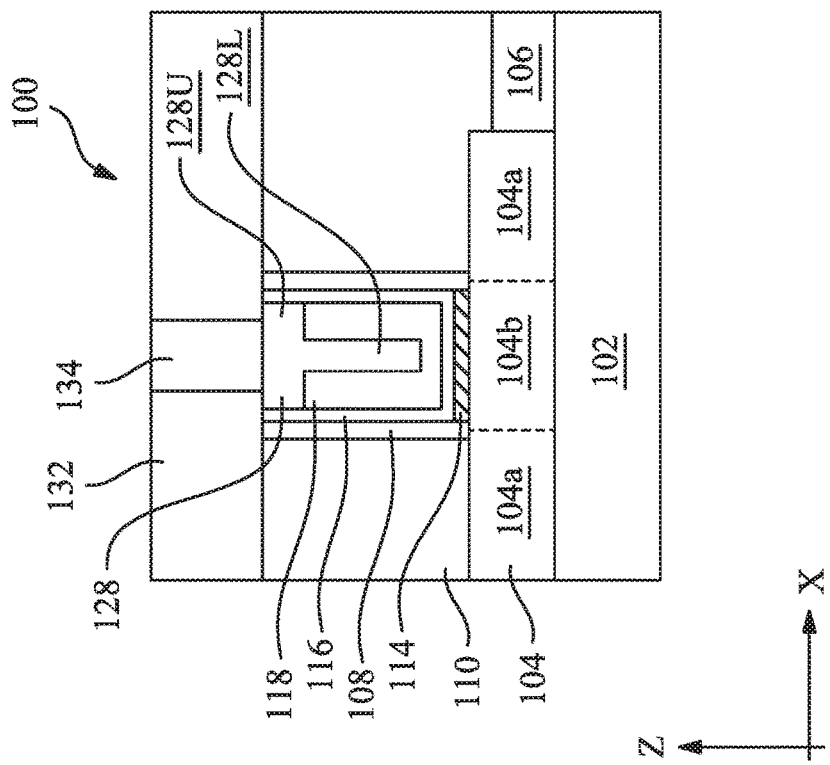

At operation 220, the method 200 (FIG. 2B) forms a gate contact 134 over the metal filling layer 128. Referring to FIG. 3K, the gate contact 134 penetrates a dielectric layer 132 and electrically contacts the metal filling layer 128. In an embodiment, the operation 220 involves a variety of processes including deposition, CMP, photolithography, and etching processes. For example, the operation 220 deposits the dielectric layer 132 over the layers 108, 110, and 128, and performs a CMP process to the dielectric layer 132. The dielectric layer 132 may include a dielectric material similar to that of the dielectric layer 110 and may be deposited by a PECVD process, a FCVD process, or other suitable deposition techniques. In embodiments, the dielectric layer 132 may include one or more material layers. Subsequently, the operation 220 forms an opening in the dielectric layer 132 through photolithography patterning and etching processes. The opening exposes the metal filling layer 128. Due to the enlarged footprint of the metal filling layer 128, the operation 220 has a large process window in the photolithograph patterning process. Subsequently, the operation 220 forms the gate contact 134 in the opening. As shown in FIG. 3K, the gate contact 134 fully lands on the metal filling layer 128. Since the metal filling layer 128 is a low resistance material, the overall gate contact resistance is reduced.

In an embodiment, the gate contact 134 includes a barrier layer and a gate via over the barrier layer. The barrier layer may comprise tantalum (Ta), tantalum nitride (TaN), or another suitable metal-diffusion barrier material; may be deposited using CVD, PVD, ALD, or other suitable processes. The gate via uses a conductive material such as aluminum (Al), tungsten (W), copper (Cu), cobalt (Co), combinations thereof, or other suitable material; and can be deposited using a suitable process, such as CVD, PVD, plating, and/or other suitable processes.

Figure 3L:
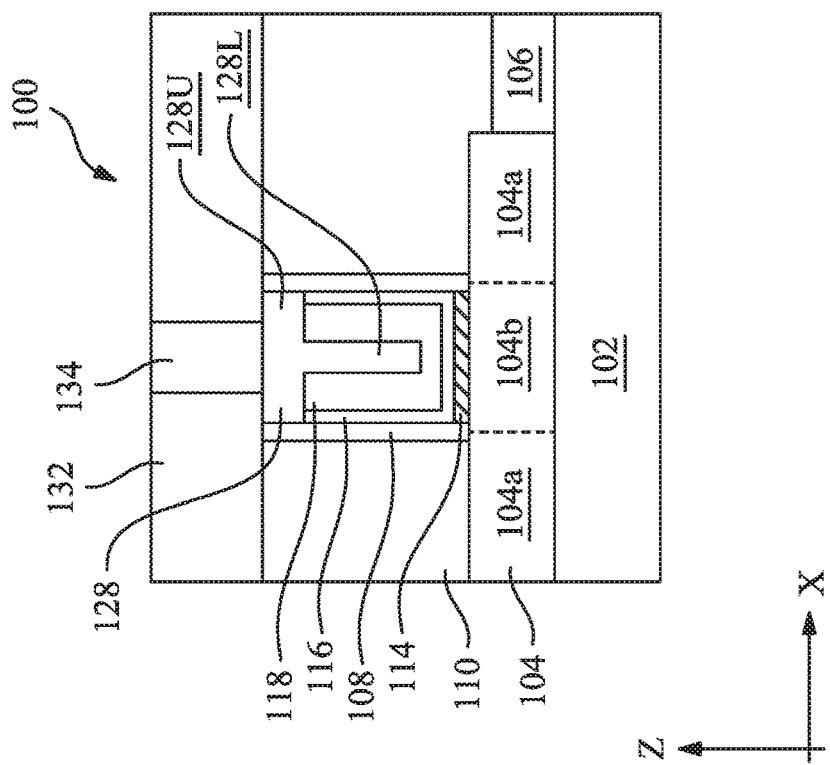

FIG. 3L shows another embodiment of the device 100 which does not undergo the operation 214 as discussed above. Referring to FIG. 3L, in this embodiment, the upper portion 128U of the metal filling layer 128 is surrounded by the gate dielectric layer 116. Therefore, it has a smaller footprint than the embodiment in FIG. 3K. However, its footprint is still larger than that of the lower portion 128L.

At operation 222, the method 200 (FIG. 2B) proceeds to further steps to complete the fabrication of the device 100. For example, the operation 222 may form metal interconnects connecting multiple components (e.g., p-type FinFETs, n-type FinFETs, other types of FETs, resistors, capacitors, and inductors) of the device 100 to form a complete IC.

Figure 4:
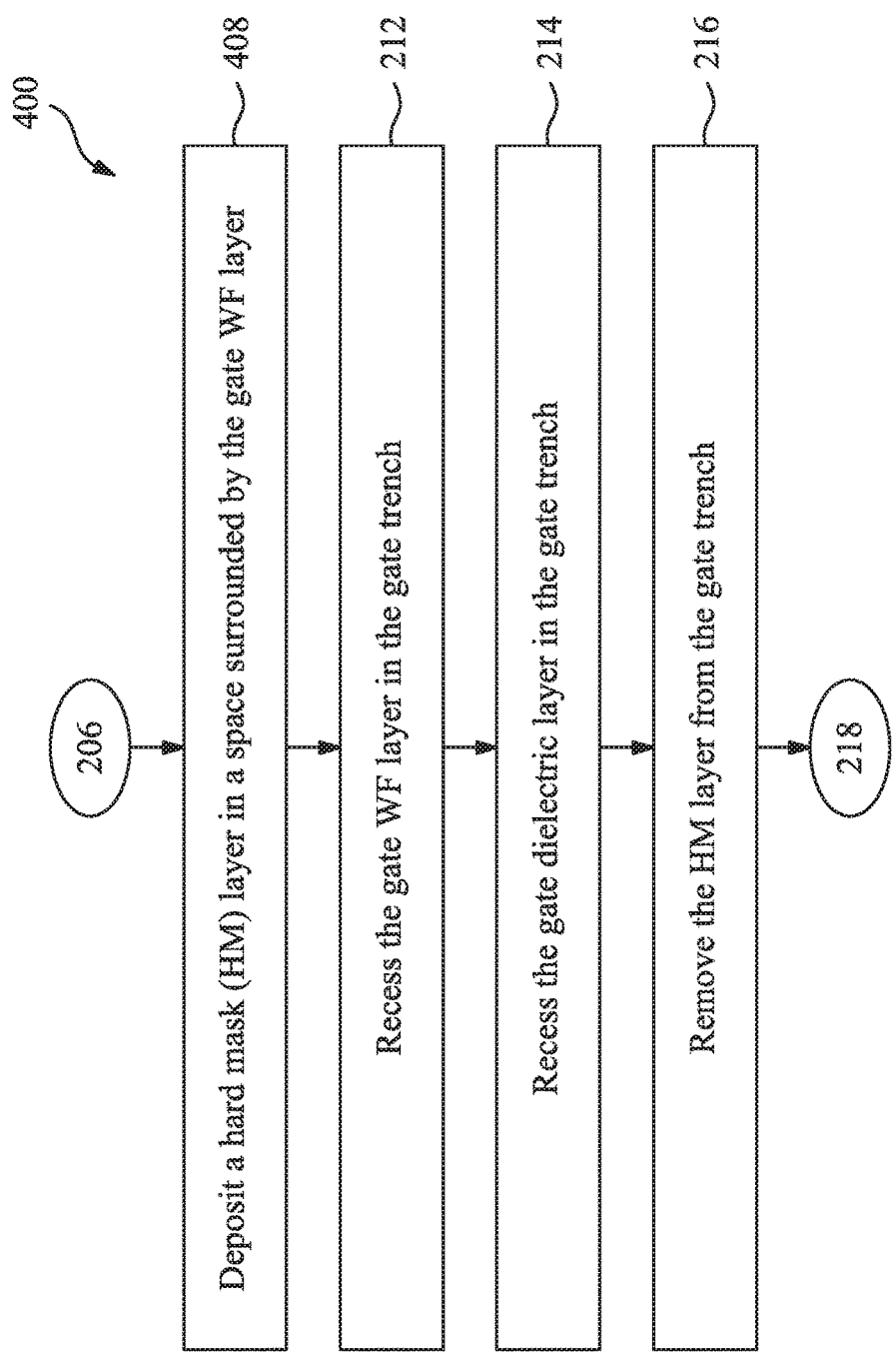
FIG. 4 shows a block diagram of a method of forming a semiconductor device, according to various aspects of the present disclosure.

FIG. 4 illustrates a flow chart of a method 400, which may be considered an embodiment of the method 200. Many respects of the method 400 are similar to those of the method 200. Therefore, it is briefly discussed below, in conjunction with FIGS. 5A-5C.

Referring to FIG. 4, the method 400 proceeds from the operation 206 to operation 408 that deposits the HM layer 122 in the space 120 surrounded by the WF layer 118 (FIG. 5A). In an embodiment, the operation 408 includes the operations 208 and 210, as discussed above, where the operation 210 only slightly recesses the HM layer 122 within the gate trench 122 (i.e., the depth $D_1$ is very small). In another embodiment, the operation 408 includes the operations 208 for depositing the HM layer 122 over the various layers 108, 110, 116, and 118 (see FIG. 3E); and further includes the operation 210 that uses a CMP process to etch back the HM layer 122, thereby leaving a portion of the HM layer 122 in the gate trench 112 as shown in FIG. 5A.

The method 400 (FIG. 4) proceeds from the operation 408 to the operation 212 that recesses the WF layer 118 in the gate trench 112, as shown in FIG. 5B. As a result, the top surface $S_{118}$ is below the top surface $S_{110}$. In the present embodiment, the recessing of the WF layer 118 is self-aligned, i.e., without a photolithography patterning process. This is an example where the surface $S_{118}$ is below (or lower than) the surface $S_{122}$. Further, the operation 212 uses the selective etching process discussed with respect to FIG. 3G.

Figure 5C:
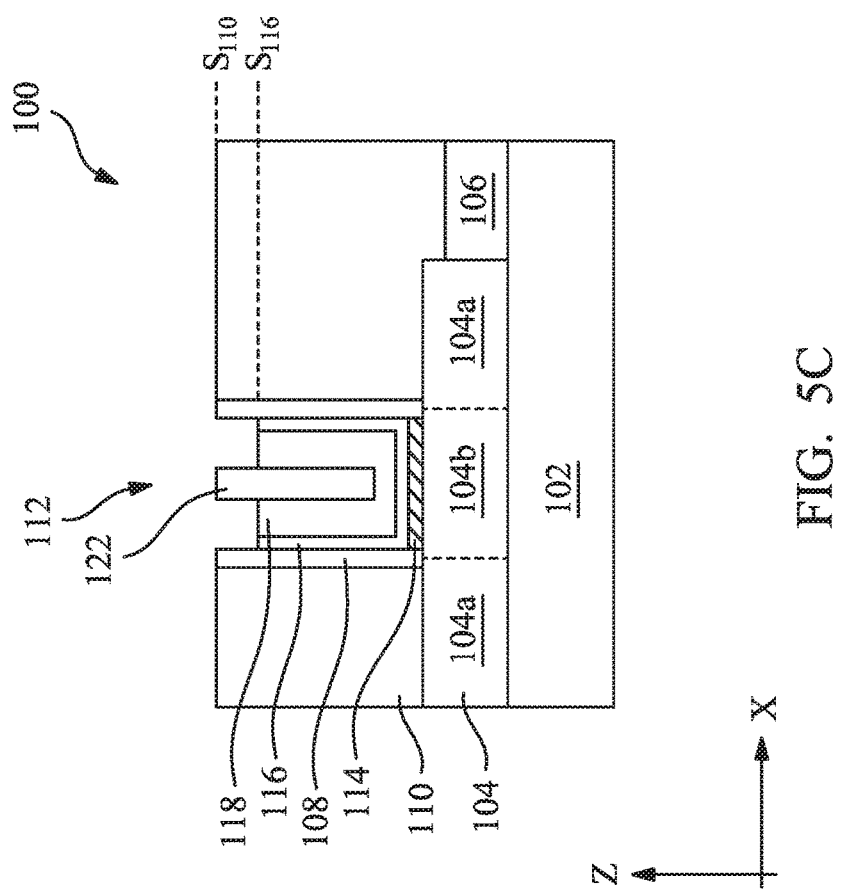

The method 400 (FIG. 4) proceeds from the operation 212 to the operation 214 that recesses the gate dielectric layer 116 in the gate trench 112, as shown in FIG. 5C. As a result, the top surface $S_{116}$ is below the top surface $S_{110}$. In the present embodiment, the recessing of the gate dielectric layer 116 is self-aligned, i.e., without a photolithography patterning process. Further, the operation 214 uses the selective etching process discussed with respect to FIG. 3H. In embodiments, the method 400 may skip the operation 214 as discussed above. In alternative embodiments, the method 400 may perform the operations 212 and 214 in one fabrication step, as discussed above.

The method 400 (FIG. 4) proceeds to the operation 216 that removes the HM layer 122 from the gate trench 112. In an embodiment, this is the same as the operation 216 of the method 200 (FIG. 2B). As a result, the device 100 provides the first space 120 and the second space 124, as shown in FIG. 3I. Thereafter, the method 400 (FIG. 4) proceeds to the operation 218 to deposit the metal filling layer 128, as discussed above with respect to FIGS. 2B and 3J.

Although not intended to be limiting, one or more embodiments of the present disclosure provide many benefits to a semiconductor device and the formation thereof. For example, embodiments of the present disclosure recess a gate work function layer and a gate dielectric layer before depositing a metal filling layer. The resultant metal filling layer has an enlarged upper portion that provides a larger footprint than typical metal gates. This advantageously enlarges process window for gate contact patterning processes. This also advantageously reduces gate contact resistance. Furthermore, the recessing of the gate work function layer and the gate dielectric layer are self-aligned, i.e. without a photolithography patterning process. Embodiments of the present disclosure can be readily integrated into existing manufacturing flow for improving metal gate fabrication processes and improving device performance.

In one exemplary aspect, the present disclosure is directed to a method of forming a semiconductor device. The method includes receiving a device having a substrate and a first dielectric layer over the substrate. The first dielectric layer surrounds a gate trench. The method further includes depositing a gate dielectric layer in the gate trench, depositing a gate work function (WF) layer in the gate trench and over the gate dielectric layer, and forming a hard mask (HM) layer in a space that is in the gate trench and surrounded by the gate WF layer. The method further includes recessing the gate WF layer such that a top surface of the gate WF layer in the gate trench is below a top surface of the first dielectric layer. After the recessing of the gate WF layer, the method further includes removing the HM layer in the gate trench. After the removing of the HM layer, the method further includes depositing a metal layer in the gate trench.

In another exemplary aspect, the present disclosure is directed to a method of forming a semiconductor device. The method includes receiving a device having a substrate, a gate spacer over the substrate and providing a gate trench, and a first dielectric layer over the substrate and surrounding the gate spacer. The method further includes depositing a gate dielectric layer on a bottom and sidewalls of the gate trench, and depositing a gate work function (WF) layer in the gate trench and over the gate dielectric layer. The method further includes forming a hard mask (HM) layer over the substrate and filling a space surrounded by the gate WF layer, and etching the HM layer such that a top surface of the HM layer in the gate trench is below a top surface of the first dielectric layer. The method further includes etching the gate WF layer such that a top surface of the gate WF layer in the gate trench is below the top surface of the first dielectric layer. The method further includes etching the gate dielectric layer such that a top surface of the gate dielectric layer in the gate trench is below the top surface of the first dielectric layer. The method further includes removing the HM layer in the gate trench, thereby providing a first space surrounded by the gate WF layer and a second space between the respective top surfaces of the gate WF layer and the gate dielectric layer and the top surface of the first dielectric layer. The method further includes filling a metal layer in the first and second spaces.

In another exemplary aspect, the present disclosure is directed to a semiconductor device. The semiconductor device includes a substrate; a first dielectric layer over the substrate and surrounding a gate trench; a gate dielectric layer over a bottom and sidewalls of the gate trench; and a gate work function (WF) layer over the gate dielectric layer in the gate trench, wherein a top surface of the gate WF layer is lower than a top surface of the first dielectric layer. The semiconductor device further includes a metal layer filling a first space and a second space in the gate trench, wherein the first space is surrounded by the gate WF layer and the second space is between the top surface of the gate WF layer and the top surface of the first dielectric layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A method of forming a semiconductor device, comprising:
receiving a device having a substrate and a first dielectric layer over the substrate, the first dielectric layer surrounding a gate trench;
depositing a gate dielectric layer in the gate trench;
depositing a gate work function (WF) layer in the gate trench and over the gate dielectric layer;
after the depositing of the gate WF layer, forming a hard mask (HM) layer in a space that is in the gate trench and surrounded by the gate WF layer;
recessing the gate WF layer such that a top surface of the gate WF layer in the gate trench is below a top surface of the first dielectric layer and above an uppermost portion of a top surface of the HM layer;

after the recessing of the gate WF layer, removing the HM layer in the gate trench; and after the removing of the HM layer, depositing a metal layer in the gate trench, wherein the metal layer is in physical contact with a sidewall surface of the gate WF layer that is deposited before the HM layer is formed.

2. The method of claim 1, further comprising, before the depositing of the metal layer:

recessing the gate dielectric layer such that a top surface of the gate dielectric layer in the gate trench is below the top surface of the first dielectric layer.

3. The method of claim 1, further comprising:

forming a gate contact over the metal layer and electrically connecting to the metal layer.

4. The method of claim 1, wherein the recessing of the gate WF layer includes a selective etching process that is tuned to etch the gate WF layer while the first dielectric layer and the HM layer remain substantially unchanged.

5. The method of claim 1, wherein the recessing of the gate WF layer also recesses the gate dielectric layer such that a top surface of the gate dielectric layer in the gate trench is below the top surface of the first dielectric layer.

6. The method of claim 1, wherein the removing of the HM layer includes a selective etching process that is tuned to etch the HM layer while the first dielectric layer, the gate dielectric layer, and the gate WF layer remain substantially unchanged.

7. The method of claim 1, further comprising, before the forming of the HM layer:

etching the gate WF layer to provide the space.

8. The method of claim 1, wherein the forming of the HM layer includes:

depositing a HM material over the substrate and filling the space; and etching back the HM material.

9. The method of claim 8, wherein the etching back of the HM material includes a selective etching process that is tuned to etch the HM material while the first dielectric layer, the gate dielectric layer, and the gate WF layer remain substantially unchanged.

10. The method of claim 8, wherein the etching back of the HM material includes a chemical mechanical planarization (CMP) process.

11. The method of claim 1, wherein the device further includes a gate spacer as sidewalls of the gate trench before the depositing of the gate dielectric layer, and wherein the first dielectric layer surrounds the gate spacer.

12. A method of forming a semiconductor device, comprising:

receiving a device having a substrate, a gate spacer over the substrate and providing a gate trench, and a first dielectric layer over the substrate and surrounding the gate spacer;

depositing a gate dielectric layer on a bottom and sidewalls of the gate trench;

depositing a gate work function (WF) layer in the gate trench and over the gate dielectric layer, wherein the gate WF layer surrounds a space;

partially removing the gate WF layer to enlarge the space;

forming a hard mask (HM) layer over the substrate and filling a space surrounded by the gate WF layer;

etching the HM layer such that a top surface of the HM layer in the gate trench is below a top surface of the first dielectric layer;

etching the gate WF layer such that a top surface of the gate WF layer in the gate trench is below the top surface of the first dielectric layer;

after the etching of the gate WF layer, etching the gate dielectric layer such that a top surface of the gate dielectric layer in the gate trench is below the top surface of the first dielectric layer;

removing the HM layer in the gate trench, thereby providing a first space surrounded by the gate WF layer and a second space between the respective top surfaces of the gate WF layer and the gate dielectric layer and the top surface of the first dielectric layer; and filling a metal layer in the first and second spaces.

13. The method of claim 12, wherein each of the etching of the HM layer and the removing of the HM layer includes a selective etching process that is tuned to etch the HM layer while the gate spacer, the first dielectric layer, the gate dielectric layer, and the gate WF layer remain substantially unchanged.

14. The method of claim 12, wherein the etching of the gate WF layer includes a selective etching process that is tuned to etch the gate WF layer while the gate spacer, the first dielectric layer, and the HM layer remain substantially unchanged.

15. The method of claim 12, wherein the etching of the gate WF layer and the etching of the gate dielectric layer are performed in one fabrication step.

16. A semiconductor device, comprising:

a substrate;

a first dielectric layer over the substrate and surrounding a gate trench;

a gate dielectric layer over a bottom and sidewalls of the gate trench, wherein a top surface of the gate dielectric layer is coplanar with a top surface of the first dielectric layer;

a gate work function (WF) layer over the gate dielectric layer in the gate trench, wherein a top surface of the gate WF layer is lower than a top surface of the first dielectric layer and lower than an uppermost portion of a top surface of the gate dielectric layer; and a metal layer filling a first space and a second space in the gate trench, wherein the first space is surrounded by the gate WF layer and the second space is between the top surface of the gate WF layer and the top surface of the first dielectric layer.

17. The semiconductor device of claim 16, further comprising a gate spacer as the sidewalls of the gate trench.

18. The semiconductor device of claim 16, wherein the top surface of the gate dielectric layer is lower than the top surface of the first dielectric layer, and the metal layer fills a third space between the top surface of the gate dielectric layer and the top surface of the first dielectric layer.

19. The semiconductor device of claim 16, wherein the gate dielectric layer comprises a high-k dielectric material and the metal layer comprises one of: aluminum (Al), tungsten (W), copper (Cu), and cobalt (Co).

20. The semiconductor device of claim 16, further comprising: a gate contact directly contacting the metal layer, wherein the gate contact does not directly contact the gate WF layer.

* * * * *